(12) United States Patent
Park et al.

(10) Patent No.: US 10,862,004 B2
(45) Date of Patent: Dec. 8, 2020

(54) ULTRAVIOLET SEMICONDUCTOR LIGHT EMITTING DEVICES

(71) Applicant: Samsung Electronics Co., Ltd., Suwon-si (KR)

(72) Inventors: Young Hwan Park, Yongin-si (KR); Mi Hyun Kim, Seoul (KR); Jong Uk Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 16/014,073

(22) Filed: Jun. 21, 2018

(65) Prior Publication Data

US 2019/0181298 A1 Jun. 13, 2019

(30) Foreign Application Priority Data

Dec. 13, 2017 (KR) .......................... 10-2017-0171131

(51) Int. Cl.
| | |
|---|---|
| *H01L 33/00* | (2010.01) |
| *H01L 33/32* | (2010.01) |
| *H01L 33/20* | (2010.01) |
| *H01L 33/40* | (2010.01) |
| *H01L 33/06* | (2010.01) |

(52) U.S. Cl.
CPC .......... *H01L 33/32* (2013.01); *H01L 33/0075* (2013.01); *H01L 33/06* (2013.01); *H01L 33/20* (2013.01); *H01L 33/40* (2013.01)

(58) Field of Classification Search
CPC ...................................................... H01L 33/32
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

| | | |
|---|---|---|
| KR | 2016-0141362 A | 12/2016 |
| KR | 2017-0052738 A | 5/2017 |

(Continued)

*Primary Examiner* — Mohammad M Choudhry

(74) *Attorney, Agent, or Firm* — Harness, Dickey & Pierce, P.L.C.

(57) ABSTRACT

An ultraviolet semiconductor light emitting device includes a semiconductor stack, a trench, a filling insulator, and first and second electrodes. The semiconductor stack includes first and second conductivity-type semiconductor layers and an active layer therebetween that includes an AlGaN semiconductor material. The trench extends through the second conductivity-type semiconductor layer and the active layer to the first conductivity-type semiconductor layer and has a first width. The filling insulator fills the trench such that the filling insulator extends at least through the active layer in the trench and includes of an insulating material having a particular refractive index. The first electrode is connected to the first conductivity-type semiconductor layer, and the second electrode is connected to the second conductivity-type semiconductor layer.

20 Claims, 10 Drawing Sheets

(56) References Cited

U.S. PATENT DOCUMENTS

| | | | |
|---|---|---|---|
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,139,048 B2 * | 11/2006 | Han | G02B 6/0018 349/62 |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,455,300 B1 | 9/2016 | Collins et al. | |
| 2015/0132871 A1 * | 5/2015 | Wang | H01L 21/44 438/23 |
| 2015/0243846 A1 * | 8/2015 | Kwon | H01L 33/62 257/13 |
| 2016/0126409 A1 * | 5/2016 | Sannikov | G09G 3/32 345/82 |
| 2016/0133788 A1 * | 5/2016 | Kim | H01L 33/20 257/98 |
| 2016/0351764 A1 * | 12/2016 | Cha | H01L 33/58 |
| 2017/0125631 A1 | 5/2017 | Lee et al. | |
| 2017/0133563 A1 | 5/2017 | Chung et al. | |
| 2017/0261161 A1 | 9/2017 | Moon et al. | |

FOREIGN PATENT DOCUMENTS

| | | |
|---|---|---|
| KR | 2017-0054054 A | 5/2017 |
| KR | 2017-0084148 A | 7/2017 |
| KR | 10-1773709 B1 | 8/2017 |
| KR | 2017-0106575 A | 9/2017 |
| WO | WO-2016/073678 A1 | 5/2016 |

* cited by examiner

ULTRAVIOLET SEMICONDUCTOR LIGHT EMITTING DEVICES

CROSS-REFERENCE TO RELATED APPLICATIONS

This application claims benefit of priority, under 35 U.S.C. § 119, to Korean Patent Application No. 10-2017-0171131 filed on Dec. 13, 2017 in the Korean Intellectual Property Office, the disclosure of which is incorporated herein by reference in its entirety.

BACKGROUND

1. Field

The present disclosure relates to ultraviolet semiconductor light emitting devices.

2. Description of Related Art

In recent years, ultraviolet light sources have been used for various devices, such as sterilizing and disinfecting devices or UV curing devices. As ultraviolet light sources, semiconductor light emitting diodes (LEDs) are gaining popularity, based at least in part on being relatively environmentally friendly and highly efficient. For example, nitride semiconductor LEDs are widely used.

However, ultraviolet nitride semiconductor LEDs not only have low external quantum efficiency due to Auger recombination caused by crystal defects and a low carrier concentration (in particular, a low hole concentration), but also have very low light extraction efficiency, since they are formed of semiconductor materials having high refractive indices. For example, since nitride semiconductor LEDs (e.g. UV-B and UV-C) configured to emit a short-wavelength ultraviolet light have extremely low light extraction efficiency (e.g. 2 to 3%), commercialization thereof may be difficult. Such low light extraction efficiency is because light generated in an $Al_xGa_{1-x}N$ quantum well travels more in a lateral direction than in a vertical direction, compared to light generated in an $In_xGa_{1-x}N$ quantum well. In addition, the light traveling in the lateral direction is highly likely to be reabsorbed into a semiconductor stack such as an active layer.

SUMMARY

Example embodiments provide an ultraviolet semiconductor light emitting device having substantially improved luminous efficiency based on improving light extraction efficiency in a lateral direction.

According to some example embodiments, an ultraviolet semiconductor light emitting device may include a semiconductor stack. The semiconductor stack may include a first conductivity-type AlGaN semiconductor layer, the first conductivity-type AlGaN semiconductor layer including a first AlGaN semiconductor material. The semiconductor stack may include a second conductivity-type AlGaN semiconductor layer, the second conductivity-type AlGaN semiconductor layer including a second AlGaN semiconductor material. The semiconductor stack may include an active layer between the first conductivity-type AlGaN semiconductor layer and the second conductivity-type AlGaN semiconductor layer and including a third AlGaN semiconductor material. The ultraviolet semiconductor light emitting device may include at least one trench extending to the first conductivity-type AlGaN semiconductor layer through the second conductivity-type AlGaN semiconductor layer and the active layer, a filling insulator filling the at least one trench such that the filling insulator extends at least through the active layer in the at least one trench, the filling insulator including an insulating material, the insulating material having a lower refractive index than the active layer, a first electrode connected to the first conductivity-type AlGaN semiconductor layer, and a second electrode connected to the second conductivity-type AlGaN semiconductor layer. A sidewall angle of inclination ($\theta_0$) of the at least one trench, an incidence angle ($\theta_1$) in a lateral direction with respect to a sidewall of the at least one trench, and a refraction angle ($\theta_2$) with respect to the lateral direction satisfy the following equations (1) to (3):

$$\theta_0 = 90° - \theta_1 \ldots \quad (1)$$

$$n1 \times \sin(\theta_1) = n2 \times \sin(\theta_2) \ldots \quad (2)$$

$$\theta_2 \geq 9° + \theta_1 \ldots \quad (3),$$

wherein n1 is a refractive index of the active layer, and n2 is a refractive index of the insulating material.

According to some example embodiments, an ultraviolet semiconductor light emitting device may include a semiconductor stack. The semiconductor stack may include a first conductivity-type AlGaN semiconductor layer, the first conductivity-type AlGaN semiconductor layer including a first AlGaN semiconductor material. The semiconductor stack may include a second conductivity-type AlGaN semiconductor layer, the second conductivity-type AlGaN semiconductor layer including a second AlGaN semiconductor material. The semiconductor stack may include an active layer between the first conductivity-type AlGaN semiconductor layer and the second conductivity-type AlGaN semiconductor layer and including a third AlGaN semiconductor material. The ultraviolet semiconductor light emitting device may include at least one first trench extending to the first conductivity-type AlGaN semiconductor layer through the second conductivity-type AlGaN semiconductor layer and the active layer, the at least one first trench having a first width, at least one second trench extending to the first conductivity-type AlGaN semiconductor layer through the second conductivity-type AlGaN semiconductor layer and the active layer, the at least one second trench having a second width, the second width greater than the first width, a filling insulator filling the at least one first trench such that the filling insulator extends at least through the active layer in the at least one first trench, the filling insulating including an insulating material, the insulating material having a particular refractive index, a first contact electrode connected to the first conductivity-type AlGaN semiconductor layer through the at least one second trench, and a second contact electrode on the second conductivity-type AlGaN semiconductor layer.

According to some example embodiments, an ultraviolet semiconductor light emitting device may include a semiconductor stack. The semiconductor stack may include a first conductivity-type semiconductor layer including a $Al_{x1}Ga_{1-x2}N$ ($0 < x1 \leq 1$) semiconductor material, a second conductivity-type semiconductor layer including a $Al_{x2}Ga_{1-x2}N$ ($0 < x2 \leq 1$) semiconductor material, and an active layer between the first and second conductivity-type semiconductor layers and including an $Al_{x3}GA_{1-x3}N$ ($0 < x3 < x1$ and $0 < x3 < x2$) semiconductor material. The ultraviolet semiconductor light emitting device may include a plurality of first trenches extending through the second conductivity-type semiconductor layer and the active layer to reach the first conductivity-type semiconductor layer, each first trench of the plurality of first trenches having a first width, a plurality of second trenches extending through the second conductivity-type semiconductor layer and the active layer to reach the first conductivity-type semiconductor layer, each trench of the plurality of second trenches having a second width, the second width greater than the first width, an insulating layer filling the plurality of first trenches and on inner sidewalls of the plurality of second trenches and top surfaces of the second conductivity-type semiconductor layer, a first electrode connected to the first conductivity-type semiconductor layer through the plurality of second trenches, and a second electrode on the second conductivity-type semiconductor layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
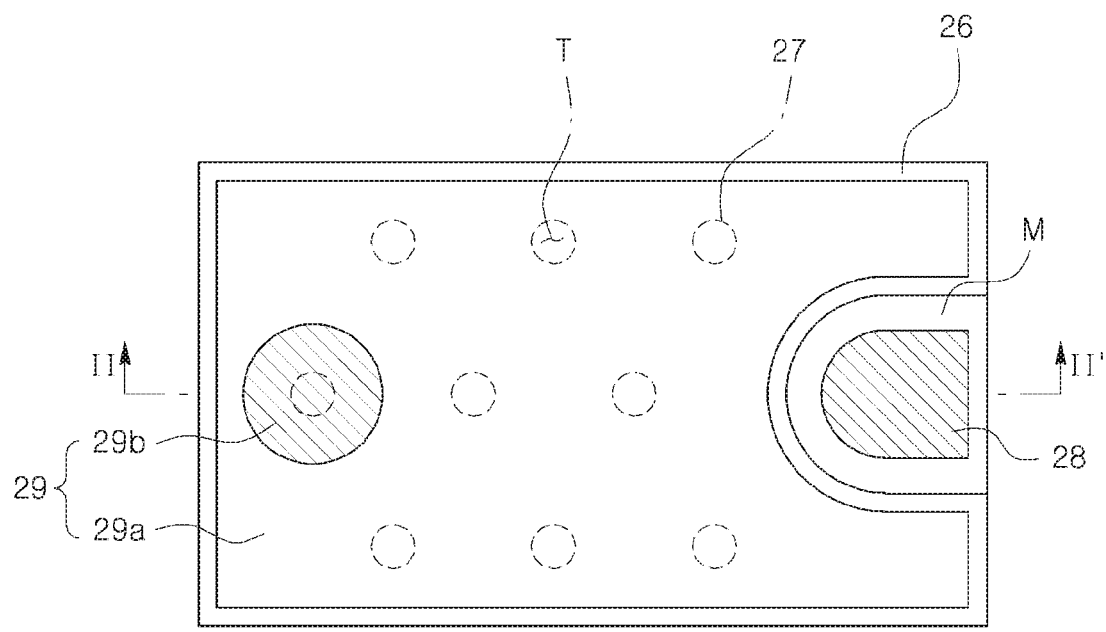
FIG. 1 is a top plan view of an ultraviolet semiconductor light emitting device according to some example embodiments.
Figure 2:
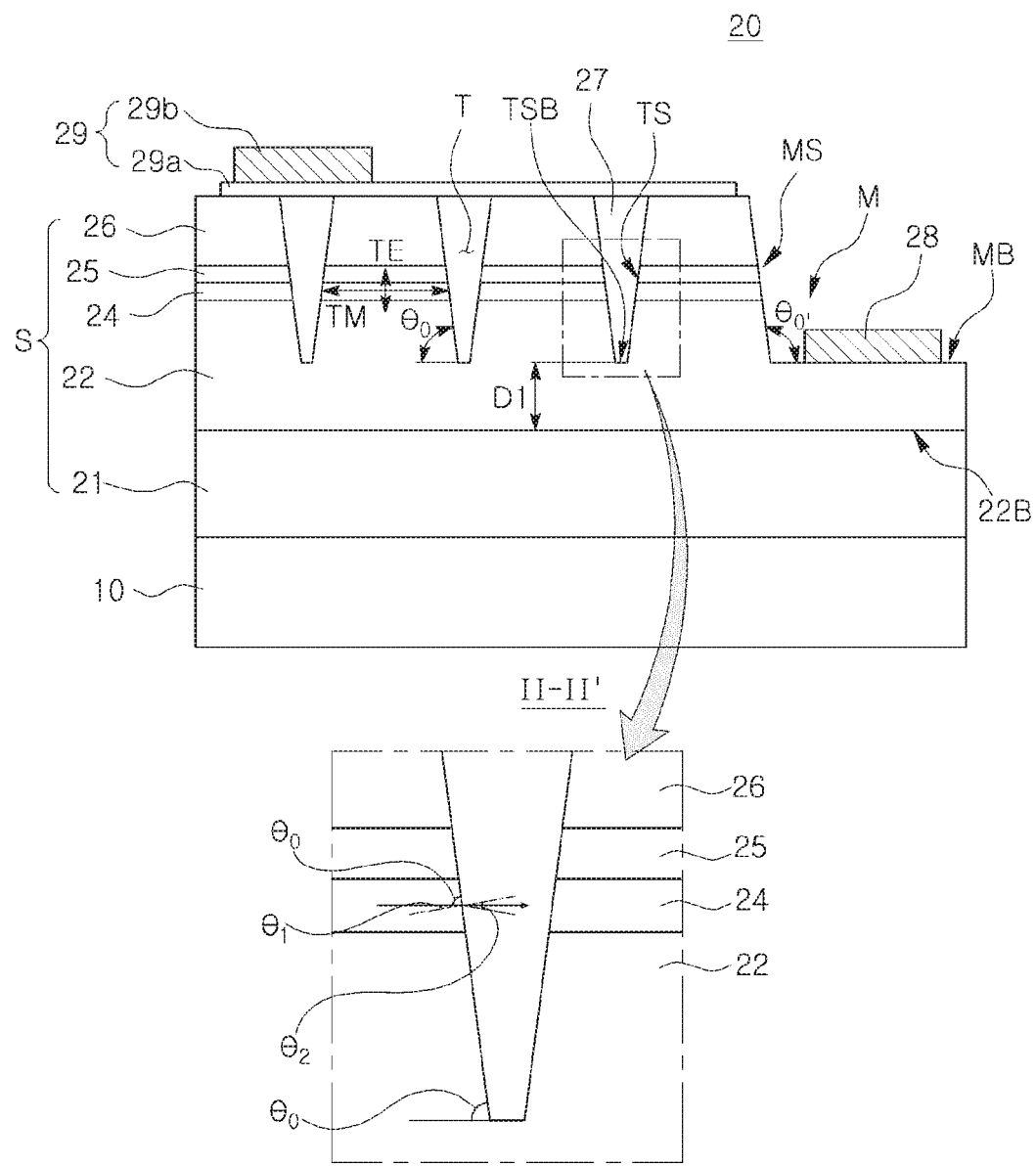
FIG. 2 is a cross-sectional view, along view line II-II', of the ultraviolet semiconductor light emitting device illustrated in FIG. 1.

FIG. 1 is a top plan view of an ultraviolet semiconductor light emitting device according to some example embodiments, and FIG. 2 is a cross-sectional view, along view line II-II', of the ultraviolet semiconductor light emitting device illustrated in FIG. 1.

Referring to FIGS. 1 and 2, an ultraviolet semiconductor light emitting device 20 according to some example embodiments may include a substrate 10 and a semiconductor stack S disposed on the substrate 10 and configured to emit ultraviolet light. The semiconductor stack S may include first and second conductivity-type semiconductor layers 22 and 26 and an active layer 24 disposed between the first and second conductivity-type semiconductor layers 22 and 26.

The substrate 10 may be an insulating substrate, a conductive substrate, or a semiconductive substrate. For example, the substrate 10 may be sapphire, AlN, SiC, $MgAl_2O_4$, MgO, $LiAlO_2$, or $LiGaO_2$. The semiconductor stack S according to some example embodiments may include a base layer 21 formed on the substrate 10 and configured to grow a first conductivity-type semiconductor layer 22. For example, the base layer 21 may be formed of a nitride material, such as AlN or AlGaN.

The first conductivity-type semiconductor layer 22 may be an n-type nitride semiconductor material represented by $Al_{x1}Ga_{1-x1}N$ ($0<x1\leq1$), and the n-type impurities may be silicon (Si). Restated, the first conductivity-type semiconductor layer 22 (e.g., first conductivity-type AlGaN semiconductor layer) may include a first AlGaN semiconductor material, and the first conductivity-type semiconductor layer 22 may include a $Al_{x1}Ga_{1-x1}N$ ($0<x1\leq1$) semiconductor material. For example, the first conductivity-type semiconductor layer 22 may include n-type AlGaN. The second conductivity-type semiconductor layer 26 may be a p-type nitride semiconductor material represented by $Al_{x2}Ga_{1-x2}N$ ($0<x2\leq1$), and the p-type impurities may be magnesium (Mg). Restated, the second conductivity-type semiconductor layer 26 (e.g., second conductivity-type AlGaN semiconductor layer) may include a second AlGaN semiconductor material, and the second AlGaN semiconductor material may be different from the first AlGaN semiconductor material. The second conductivity-type semiconductor layer 26 may include a $Al_{x2}Ga_{1-x2}N$ ($0<x2\leq1$) semiconductor material. For example, the second conductivity-type semiconductor layer 26 may include p-type AlGaN.

In some example embodiments, an aluminum (Al) composition ratio (x1) of the first conductivity-type semiconductor layer 22 may be in a range of 0.55 to 0.70, and more preferably in a range of 0.60 to 0.65. Likewise, an Al composition ratio (x2) of the second conductivity-type semiconductor layer 26 may be in a range of 0.55 to 0.70, and more preferably in a range of 0.60 to 0.65.

The active layer 24 according to the example may include a quantum well formed of ("at least partially comprising") $Al_{x3}Ga_{1-x3}N$ ($0<x3<1$). Restated, the active layer 24 may include a third AlGaN semiconductor material that may be different from one or more of the aforementioned first and second AlGaN semiconductor materials. The active layer including an $Al_{x3}Ga_{1-x3}N$ ($0<x3<x1$ and $0<x3<x2$) semiconductor material. The active layer 24 may have a single quantum well (SQW) structure having a single quantum well, but is not limited thereto. The active layer 24 may have a multiple quantum well (MQW) structure in which a plurality of quantum well layers formed of $Al_{xa}Ga_{1-xa}N$ ($0<xa<1$) and a plurality of quantum barrier layers formed of $Al_{xb}Ga_{1-xb}N$ ($xa<xb<1$) are alternately stacked. Restated, the active layer 24 may include an alternating stack of first quantum well layers and second quantum well layers, where the first quantum well layers include $Al_{xa}Ga_{1-xa}N$ ($0<xa<1$) and the second quantum barrier layers include $Al_{xb}Ga_{1-xb}N$ ($xa<xb<1$).

The quantum well of the active layer 24 may have a bandgap by which a wavelength of the ultraviolet light is determined. The active layer 24 according to some example embodiments may be configured to emit light having a wavelength in a range of about 210 nm to about 315 nm. The first and second conductivity-type semiconductor layers 22 and 26 may have a larger bandgap than the quantum well so that the ultraviolet light generated in the active layer 24 is not absorbed. Restated, at least one semiconductor layer of the first conductivity-type semiconductor layer 22 and the second conductivity-type semiconductor layer 26 may have a larger energy bandgap than a third AlGaN semiconductor material of the active layer 24. For example, an Al composition ratio (x3 or xa) of the quantum well may be lower than the Al composition ratios (x1 and x2) of the first and second conductivity-type semiconductor layers 22 and 26. For example, the Al composition ratio (x3 or xa) of the quantum well may be in a range of 0.35 to 0.5.

The semiconductor stack S, according to some example embodiments, may further include an electron blocking layer (EBL) 25 disposed between the second conductivity-type semiconductor layer 26 and the active layer 24. The electron blocking layer 25 may have a larger energy bandgap than the second conductivity-type semiconductor layer 26. The electron blocking layer 25 may be a p-type nitride semiconductor material represented by $Al_{x4}Ga_{1-x4}N$ ($x2<x4\leq1$). The electron blocking layer 25 may include an AlGaN semiconductor layer having an Al composition ratio greater than an Al composition ratio of the second conductivity-type semiconductor layer 26. For example, an Al composition ratio (x4) of the electron blocking layer 25 may be about 0.8 or more.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The ultraviolet semiconductor light emitting device 20 according to some example embodiments may include a plurality of trenches T passing through the second conductivity-type semiconductor layer 26 and the active layer 24 to reach the first conductivity-type semiconductor layer 22. A filling insulator 27 formed of ("at least partially comprising") an insulating material having a refractive index n2 lower than a refractive index n1 of the active layer 24 (particularly, the quantum well) may be formed in the trenches T, such that the filling insulator 27 extends at least through the active layer 24 in the trenches T and thus is located at least at a deeper level than the active layer 24 (e.g., extends from the level of the active layer at least partially into a portion of the trenches T bounded by the first conductivity-type semiconductor layer 22), as shown in at least FIG. 2.

Since the filling insulator 27 has a relatively low refractive index, it may change a path of light traveling in a lateral direction TM, thereby increasing a probability of extraction of the light. Accordingly, the filling insulator 27 may reduce light lost in the active layer 24 and relatively weak light traveling in a vertical direction TE may be reinforced, thereby improving overall luminous efficiency.

In some example embodiments, the filling insulator 27 is illustrated as almost entirely filling the trenches T, but is not limited thereto. For example, since the filling insulator 27 affects the path of light traveling in the lateral direction TM from the active layer 24 only if a top surface of the filling insulator 27 is higher at least than a top surface of the active layer 24, the effect of improving light extraction efficiency according to some example embodiments may be expected.

The path of light traveling in the lateral direction TM may be changed by about 9 degrees or more in a direction of the first conductivity-type semiconductor layer 22 in order to achieve effective light extraction. Such a change in the path of light traveling in the lateral direction TM may depend on the refractive index of the insulating material forming the filling insulator 27 and a sidewall TS angle of inclination ($\theta_O$) of the trenches T.

When the refractive index of the active layer 24 and the refractive index of the insulating material are respectively denoted as n1 and n2, a sidewall angle of inclination ($\theta_O$) of at least one trench T, an incidence angle ($\theta_1$) in a lateral direction with respect to the sidewall of the trench T, and a refraction angle ($\theta_2$) with respect to the lateral direction may satisfy the following equations (1) to (3):

$$\theta_O = 90° - \theta_1 \ldots \quad (1)$$

$$n1 \times \sin(\theta_1) = n2 \times \sin(\theta_2) \ldots \quad (2)$$

$$\theta_2 \geq 9° + \theta_1 \ldots \quad (3).$$

For example, when the refractive index n1 of the active layer 24 or the quantum well is 2.4 and the refractive index n2 of the insulating material filling the trenches T is 1.5, the sidewall angle of inclination ($\theta_O$) of the trench T may be designed to be narrower than about 75 degrees. On the other hand, when the sidewall angle of inclination ($\theta_O$) of the trench T is designed to be 60 degrees, the refractive index n2 of the insulating material filling the trench T may be lower than 1.91.

In consideration of refractive index conditions of the insulating material, the sidewall angle of inclination ($\theta_O$) of the trench T may be about 80 degrees or less. Restated, the sidewall angle of inclination ($\theta_O$) of the trench T may be equal to or less than about 80 degrees. For example, the insulating material may include at least one material selected from a group consisting of $SiO_2$, SiN, $TiO_2$, HfO, and $MgF_2$.

The ultraviolet semiconductor light emitting device 20 according to some example embodiments may include first and second electrodes 28 and 29 respectively connected to the first and second conductivity-type semiconductor layers 22 and 26. As shown, the first electrode 28 may be connected to the first conductivity-type semiconductor layer 22 such that the first conductivity-type semiconductor layer 22 is between the first electrode 28 and the active layer 24, and the second electrode 29 may be connected to the second conductivity-type semiconductor layer 26 such that the second conductivity-type semiconductor layer 26 is between the second electrode 29 and the active layer 24. Restated further, the first electrode 28 may be directly connected to the first conductivity-type semiconductor layer 22 and may not be directly connected to the second conductivity-type semiconductor layer 26, while the second electrode 29 may be directly connected to the second conductivity-type semiconductor layer 26 and may not be directly connected to the first conductivity-type semiconductor layer 22.

As illustrated in FIG. 2, the second electrode 29 may include an ohmic contact layer 29a disposed on the second conductivity-type semiconductor layer 26, and a bonding electrode 29b disposed on a portion of the ohmic contact layer 29a. The semiconductor stack S may have ("may include") a mesa-etching area M in which the second conductivity-type semiconductor layer 26 and the active layer 24 are partially removed to expose a portion of the first conductivity-type semiconductor layer 22. Restated, as shown in at least FIG. 2, the mesa-etching area M exposes a portion of the first conductivity-type semiconductor layer 22. The first electrode 28 may be disposed on the portion of the first conductivity-type semiconductor layer 22. For example, the first electrode 28 may have an n-type electrode structure. In addition, the first electrode 28 may be formed of Al, Ti, Ni, Cr, Au, Ag, or ITO or may have a multilayer structure formed of a combination thereof.

The mesa-etching area M for forming the first electrode 28 and the trenches T for forming the filling insulator 27 may be formed in the same process. Accordingly, the mesa-etching area M may be disposed substantially at the same level as bottom surfaces of the trenches T. Restated, and as shown in FIG. 2, a bottom surface MB of the mesa-etching area M and a bottom surface TSB of a trench T may be spaced apart from a bottom surface 22B of the first conductivity-type semiconductor layer 22 by a substantially common distance D1. In addition, a sidewall angle of inclination ($\theta_0$') of the mesa-etching area M may be substantially the same as the sidewall TS angle of inclination ($\theta_0$) of the trenches T. However, the bottom surfaces of the trenches T may be higher than the mesa-etching area M in order to facilitate electrical flow, or the sidewall MS angle of inclination ($\theta_0$') of the mesa-etching area M may be changed in order to improve light extraction efficiency.

As described above, the filling insulator 27 may be employed as a structure changing a path of light, and may have a dot shape in a plan view of the ultraviolet semiconductor light emitting device 20 as illustrated in FIG. 1. The filling insulator 27 may be arranged on the semiconductor stack S at regular intervals. Since the trenches T filled with the filling insulator 27 do not include other elements such as electrodes and only require spaces for embedding the insulating layer having the low refractive index, an area from which the active layer 24 is removed in a process of forming the trenches T may be minimized. Accordingly, a plurality of filling insulators 27 may be arranged as illustrated in FIG. 1.

While the plurality of filling insulators 27 are arranged over the entire light emitting areas in order to improve light extraction efficiency as described in some example embodiments, a single filling insulator may be formed. In addition, the filling insulator 27 may be modified in various shapes and/or various arrangements, unlike those illustrated in FIG. 1.

Figure 3:
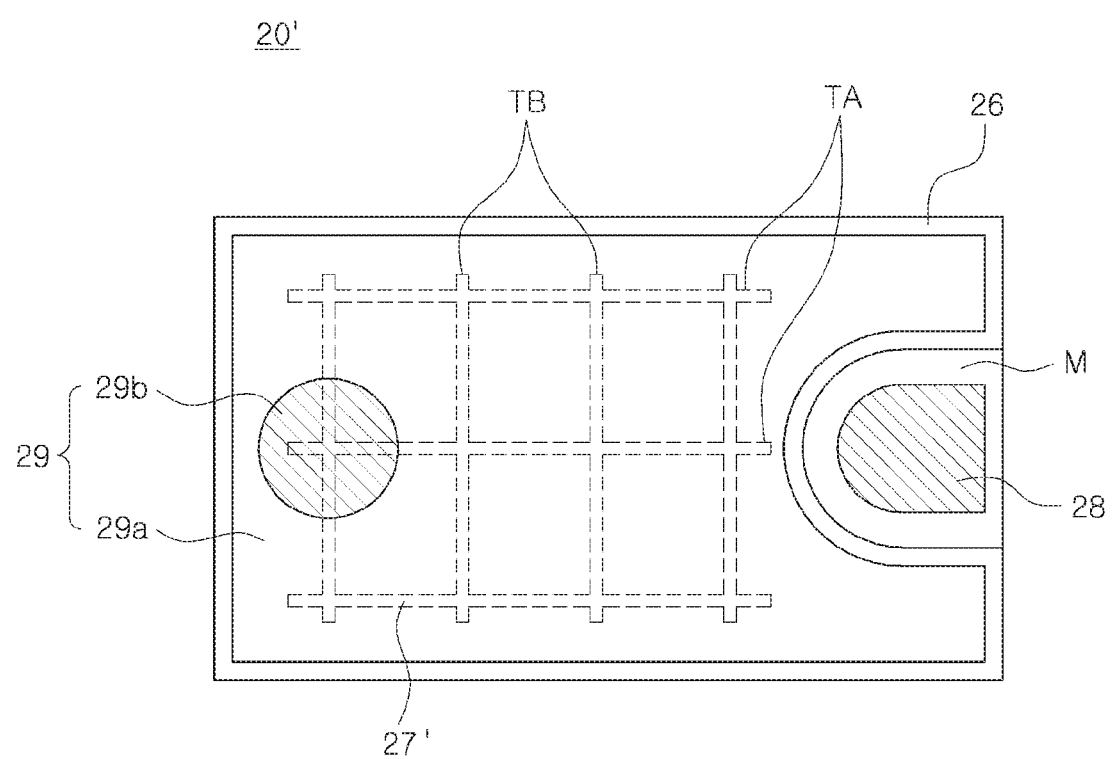
FIG. 3 is a top plan view of an ultraviolet semiconductor light emitting device according to some example embodiments.

FIG. 3 is a top plan view of an ultraviolet semiconductor light emitting device according to some example embodiments. An ultraviolet semiconductor light emitting device 20' illustrated in FIG. 3 may be understood as having a similar structure to a cross-sectional area of the ultraviolet semiconductor light emitting device 20 illustrated in FIG. 1.

Referring to FIG. 3, a filling insulator 27' may have a line shape in a plan view of the ultraviolet semiconductor light emitting device 20'. Each of the trenches TA and TB may be configured to be divided into a plurality of light emitting areas. Accordingly, crosswise trenches TA and lengthwise trenches TB may intersect each other, and provide a structure effectively changing a light path in the form of a partition wall over the entire light emitting areas in the semiconductor stack ("S" in FIG. 2).

The filling insulator 27' according to some example embodiments may be provided together with a via structure configured to form an electrode. The ultraviolet semiconductor light emitting device illustrated in FIGS. 4 and 5 may include the via structure configured to form the electrode.

Figure 4:
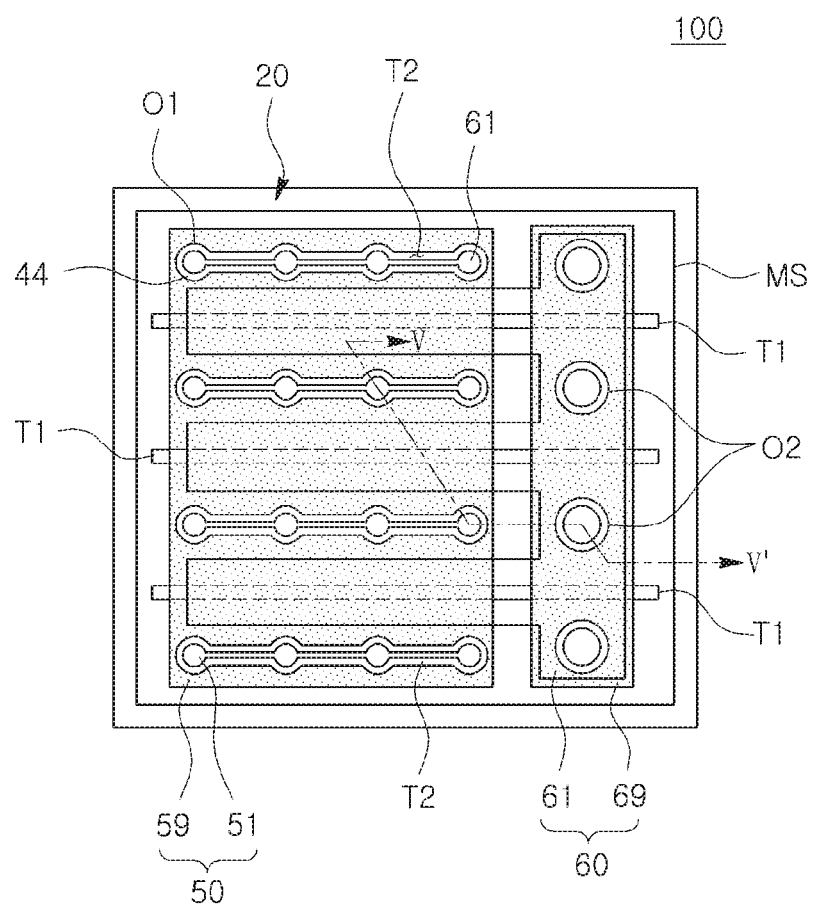
FIG. 4 is a top plan view of an ultraviolet semiconductor light emitting device according to some example embodiments.
Figure 5:
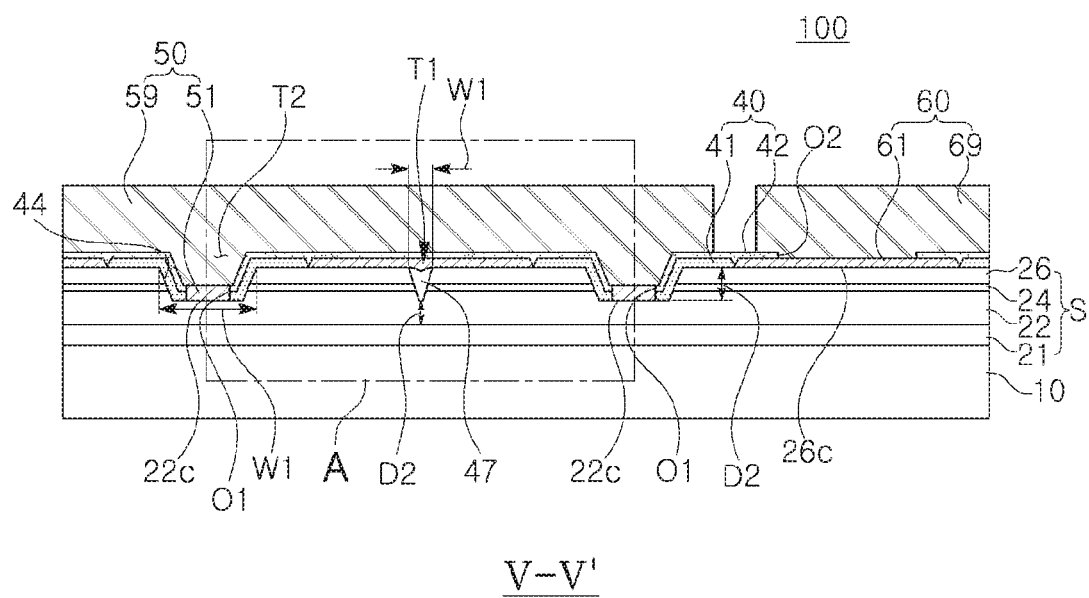
FIG. 5 is a side cross-sectional view, along view line V-V' of the ultraviolet semiconductor light emitting device illustrated in FIG. 4.
Figure 6:
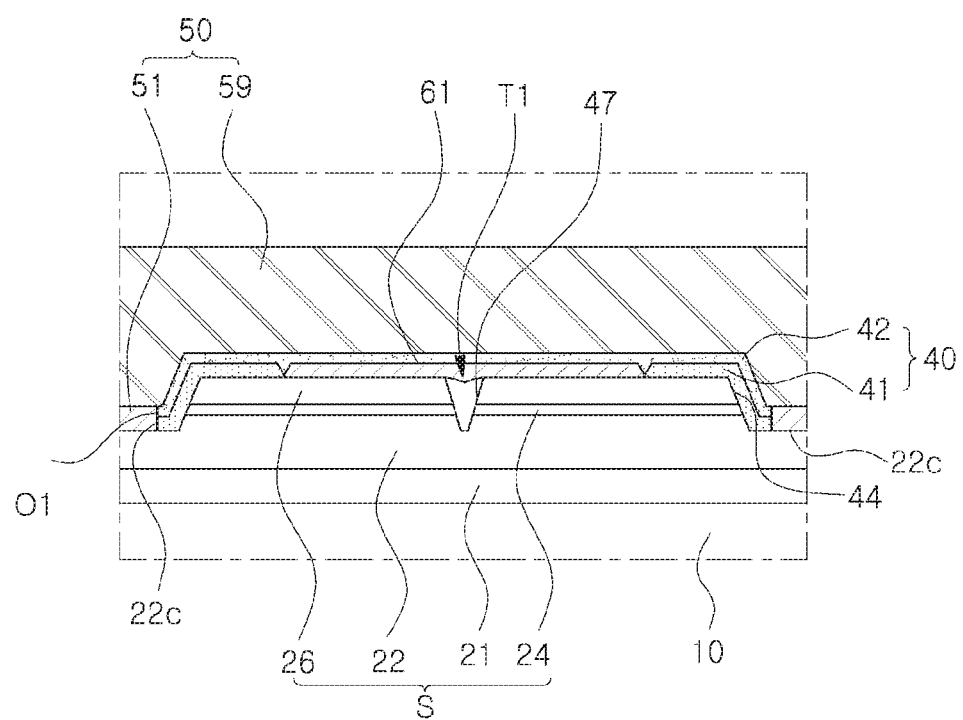
FIG. 6 is an enlarged view illustrating a portion (A region) of the ultraviolet semiconductor light emitting device illustrated in FIG. 5.

FIG. 4 is a top plan view of an ultraviolet semiconductor light emitting device according to some example embodiments, FIG. 5 is a side cross-sectional view, along view line V-V', of the ultraviolet semiconductor light emitting device illustrated in FIG. 4, and FIG. 6 is an enlarged view illustrating a portion (A region) of the ultraviolet semiconductor light emitting device illustrated in FIG. 5.

Referring to FIGS. 4 and 5, an ultraviolet semiconductor light emitting device 100 may include a substrate 10 and a semiconductor stack S disposed on the substrate 10. The semiconductor stack S may include a base layer 21, a first conductivity-type semiconductor layer 22, an active layer 24, and a second conductivity-type semiconductor layer 26, which may be understood with reference to the descriptions of corresponding components of the ultraviolet semiconductor light emitting device 20 illustrated in FIGS. 1 and 2.

The semiconductor stack S may include a plurality of first trenches T1 and a plurality of second trenches T2. The first trenches T1 may have a dot shape in a plan view, for example as shown in FIG. 1 with regard to trench T. The first trenches T1 may have a line shape in a plan view, for example as shown in FIG. 4. Each of the plurality of first and second trenches T1 and T2 may pass ("extend") through the second conductivity-type semiconductor layer 26 and the active layer 24 to reach the first conductivity-type semiconductor layer 22. Restated, each of the first and second trenches T1 and T2 may extend to the first conductivity-type semiconductor layer 22 through the second conductivity-type semiconductor layer 26 and the active layer 24.

In some example embodiments, the plurality of first trenches T1 may be provided as a structure to form the filling insulator 47 changing a path of light, and the plurality of second trenches T2 may be provided as a structure to form a first electrode 50, where the first electrode 50 is connected to the first conductivity-type semiconductor layer 22 through the plurality of second trenches T2. More specifically, while the plurality of first trenches T1 are provided to form spaces only for embedding an insulating material having a low refractive index to change the path of light, the plurality of second trenches T2 may require spaces in which the first electrode 50 connected to the first conductivity-type semiconductor layer 22 and an insulating layer 40 electrically separating the first electrode 50 from the semiconductor stack S are formed.

Accordingly, the plurality of first trenches T1 may have a first width w1, and the plurality of second trenches T2 may have a second width w2 greater than the first width w1. For example, based on top widths, the first width w1 may be about 8 μm or less, and the second width w2 may be in a range of 8 μm to 50 μm.

As illustrated in FIGS. 5 and 6, cross-sectional areas of the plurality of second trenches T2 may have an inverted trapezoidal shape, and cross-sectional areas of the plurality of first trenches T1 may have an inverted trapezoidal shape, bottom widths of which are narrower than bottom widths of the second trenches T2, or a V shape.

In some example embodiments, the first trenches T1 may be filled with the filling insulator 47 formed of an insulating material having a refractive index n2 lower than a refractive index n1 of the active layer 24 (in particular, the quantum well). Since the filling insulator 47 has a relatively low refractive index, it may change a path of light traveling in a lateral direction, thereby increasing a probability of extraction of the light.

The filling insulator 47 may almost entirely fill the first trenches T1 so as to be filled at least to a level higher that at least that of the active layer 24. Restated, the filling insulator 47 may extends at least through the active layer 24 in the first trenches T1. A sidewall angle of inclination ($\theta a$) of at least one first trench T1, an incidence angle ($\theta 1$) in a lateral direction with respect to the sidewall of the at least one first trench T1, and a refraction angle ($\theta 2$) with respect to the lateral direction may satisfy the equations (1) to (3) provided above. In consideration of refractive index conditions of the insulating material, a sidewall angle of inclination of the first trenches T1 may be about 80 degrees or less. For example, the insulating material may include at least one selected from the group consisting of $SiO_2$, SiN, $TiO_2$, HfO, and $MgF_2$.

In some example embodiments, the first trenches T1 may be formed together with the second trenches T2. The plurality of first and second trenches T1 and T2 may have substantially the same ("a common") depth D2. Likewise, the plurality of plurality of first and second trenches T1 and T2 may have substantially the same sidewall angle of inclination.

The second trenches T2 according to some example embodiments may provide a contact area 22C of the first conductivity-type semiconductor layer 22. The second trenches T2 may be formed by partially removing the second conductivity-type semiconductor layer 26 and the active layer 24 so as to expose the contact area 22C of the first conductivity-type semiconductor layer 22.

The second trenches T2 may include a plurality of line shaped areas connecting a plurality of circular areas, as illustrated in FIG. 4. However, the second trenches T2 are not limited thereto, and may have various shapes, such as one selected from a line shape, a circular shape, and a polygonal shape, or a combination thereof.

The ultraviolet semiconductor light emitting device 100 may include an insulating layer 40 disposed on a surface of the semiconductor stack S. The insulating layer 40 may be provided as a passivation layer protecting the semiconductor stack S. The insulating layer 40 may include a first insulating layer 41 and a second insulating layer 42 disposed on the first insulating layer 41. The first insulating layer 41 may be formed on the surface of the semiconductor stack S except the contact area 22C of the first conductivity-type semiconductor layer 22 and a contact area 26C of the second conductivity-type semiconductor layer 26. That is, as shown in at least FIG. 6, the first insulating layer 41 may be disposed on inner sidewalls 44 of the plurality of second trenches T2 and a portion of a top surface of the second conductivity-type semiconductor layer 26.

First and second contact electrodes 51 and 61 may be formed on the contact area 22C of the first conductivity-type semiconductor layer 22 and the contact area 26C of the second conductivity-type semiconductor layer 26, respectively. The first and second contact electrodes 51 and 61 may include electrode materials forming ohmic contacts with the first and second conductivity-type semiconductor layers 22 and 26, respectively. For example, the first contact electrode 51 may include Ti/Al/Ni/Au, and the second contact electrode 61 may include Ag or Ni/Au.

The second insulating layer 42 may include at least one first opening O1 configured to open at least a portion of the first contact electrode 51 and at least one second opening O2 configured to open at least a portion of the second contact electrode 61.

As illustrated in FIGS. 4 and 5, first and second bonding metals 59 and 69 may be formed on the second insulating layer 42. The first and second bonding metals 59 and 69 may be disposed to be adjacent to opposite edges of the semiconductor stack S, respectively. The first bonding metal 59 may be connected to the first contact electrode 51 through a first opening O1, and the second bonding metal 69 may be connected to the second contact electrode 61 through a second opening O2 (please refer to FIG. 5).

In this manner, the first electrode 50 according to some example embodiments may include the first contact electrode 51 and the first bonding metal 59. Likewise, a second electrode 60 may be on the second conductivity-type semiconductor layer 26 and may include the second contact electrode 61 and the second bonding metal 69. In a flip-chip structure, the first and second contact electrodes 51 and 61 may be formed as reflective electrodes. In some example embodiments, including the example embodiments shown in at least FIG. 5, the first contact electrode 51 may be connected to the first conductivity-type semiconductor layer 22 through at least one second trench T2, and the second contact electrode 61 may be on the second conductivity-type semiconductor layer 26.

Although the filling insulator 47 according to some example embodiments is described as being formed in an additional process, the filling insulator 47 may be formed to fill the first trenches T1 when another insulating layer (e.g. the first insulating layer 41) is formed.

Figure 7:
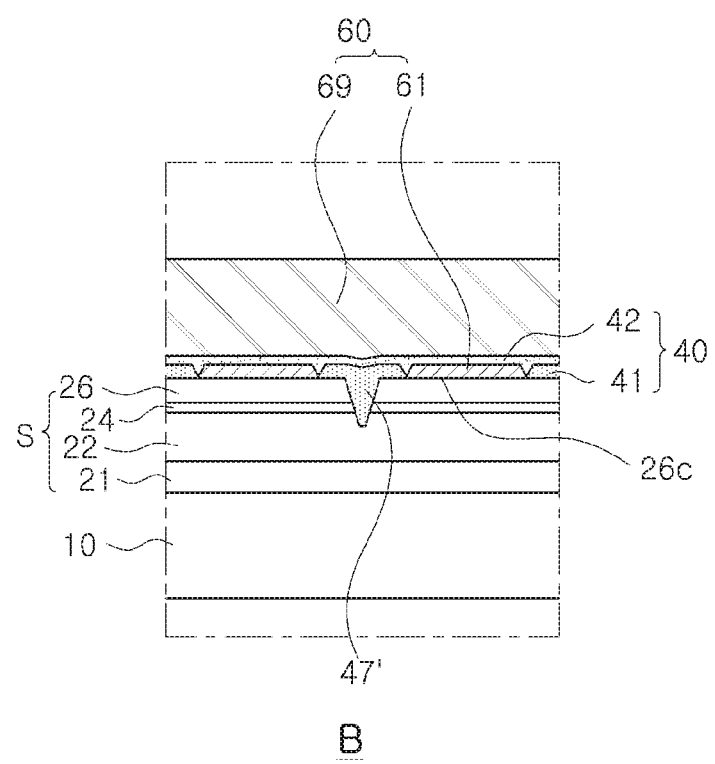
FIG. 7 illustrates a partially enlarged view of an ultraviolet semiconductor light emitting device according to some example embodiments.

FIG. 7 illustrates a partially enlarged view of an ultraviolet semiconductor light emitting device according to some example embodiments. FIG. 7 illustrates some example embodiments in which a filling insulator 47' filling the first trenches T1 may be the same as the first insulating layer 41.

Referring to FIG. 7, an insulating material filling the first trenches T1 may be a portion of the first insulating layer 41 formed on inner sidewalls 44 of the second trenches T2. More specifically, the filling insulator 47' according to some example embodiments may be the same as the insulating material formed in the same process as the first insulating layer 41. Restated, the filling insulator 47' and the first insulating layer 41 may include a common material, and a portion of the first insulating layer 41 may be in at least one of the first trenches T1. The first insulating layer 41 may be conformally formed with the inner sidewall 44 of the second trenches T2 having relatively large width. However, the first insulating layer 41 may almost entirely fill inner spaces of the first trenches T1 having a relatively small width even though it is deposited with the same thickness, as illustrated in FIG. 7. The region illustrated in FIG. 7 may be understood as corresponding to the area B of an ultraviolet semiconductor light emitting device 100A illustrated in FIG. 12.

FIGS. 8, 9, 10, 11, and 12 are process cross-sectional views provided to illustrate a method of fabricating an ultraviolet semiconductor light emitting device according to some example embodiments. The method according to some example embodiments may be a method of fabricating the ultraviolet semiconductor light emitting device 100A including the filling insulator 47' illustrated in FIG. 7.

Figure 8:
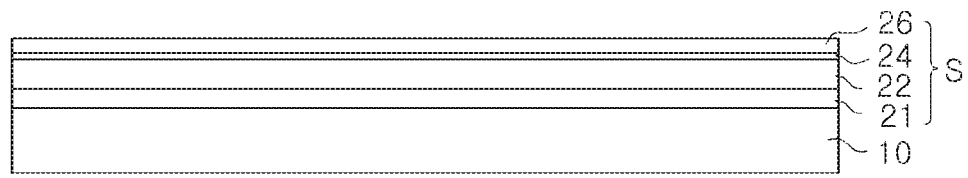
FIGS. 8, 9, 10, 11, and 12 are process cross-sectional views provided to illustrate a method of fabricating an ultraviolet semiconductor light emitting device according to some example embodiments.

Referring to FIG. 8, a semiconductor stack S configured to emit ultraviolet light may be formed by sequentially stacking a base layer 21, a first conductivity-type semiconductor layer 22, an active layer 24, and a second conductivity-type semiconductor layer 26 on a substrate 10.

For example, the substrate 10 may be formed of sapphire or AlN, as described above. The base layer 21, the first conductivity-type semiconductor layer 22, the active layer 24, and the second conductivity-type semiconductor layer 26 may be grown using a metal organic chemical vapor deposition (MOCVD) process, a hydride vapor phase epitaxy (HYPE) process, or a molecular beam epitaxy (MBE) process.

The first conductivity-type semiconductor layer 22 may include an n-type nitride semiconductor material represented by $Al_{x1}Ga_{1-x1}N$ ($0<x1\leq1$). For example, the first conductivity-type semiconductor layer 22 may include n-type AlGaN. The second conductivity-type semiconductor layer 26 may include a p-type nitride semiconductor represented by $Al_{x2}Ga_{1-x2}N$ ($0<x2\leq1$). For example, the second conductivity-type semiconductor layer 26 may include p-type AlGaN. The active layer 24 according to some example embodiments may include a quantum well formed of $Al_{x3}Ga_{1-x3}N$ ($0<x3<1$). The active layer 24 may have an MQW structure.

Figure 9:
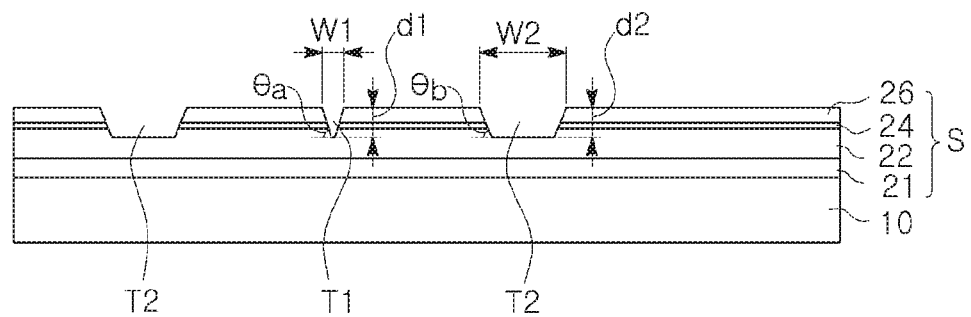

Next, referring to FIG. 9, first trenches T1 configured to form a filling insulator (47' in FIG. 7) and second trenches T2 exposing a contact area 22C of the first conductivity-type semiconductor layer 22 may be formed.

The first and second trenches T1 and T2 may be formed by partially etching the second conductivity-type semiconductor layer 26 and the active layer 24. A width w1 of the first trenches T1 may be designed to be narrower than a width w2 of the second trenches T2. A sidewall angle of inclination (θa) of the first trenches T1 may be about 80 degrees or less (e.g., equal to or less than about 80 degrees) in order to effectively change a path of light.

Since the first and second trenches T1 and T2 are formed in the same etching process, the first and second trenches T1 and T2 may substantially have the same sidewall angle of inclination (θa≈θb) and substantially the same depth (d1≈d2). The first trenches T1 may have a V-shaped cross-sectional area, and the second trenches T2 may have an inverted trapezoidal cross-sectional area. Since the first trenches T1 have the small width w1, the areas removed to form the first trenches T1 in the active layer 24 may be very small even when a large number of first trenches T1 are formed in a line shape.

In the process, the semiconductor stack S may be partially removed from the second conductivity-type semiconductor layer 26 along an edge of the substrate 10, as illustrated in FIG. 4. The process may be a reactive ion etching (RIE) process.

Figure 10:
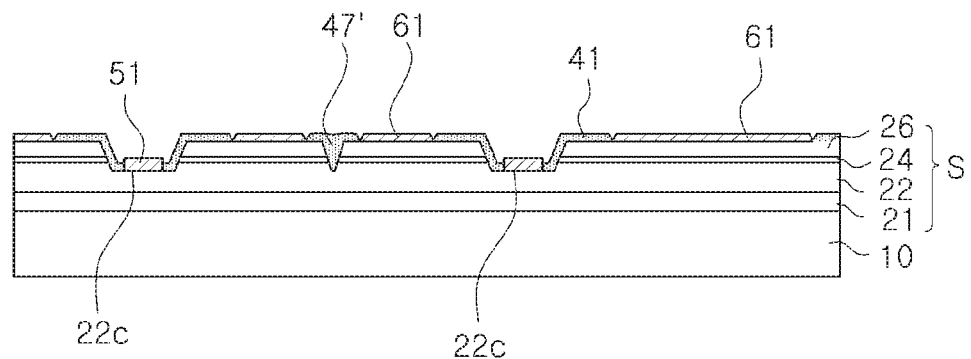

Next, referring to FIG. 10, a first insulating layer 41 surrounding a second contact electrode 61 to be formed in a subsequent process may be formed on a top surface of the semiconductor stack S. The first insulating layer 41 may be removed to expose contact areas 22C and 26C of the first conductivity-type and second conductivity-type semiconductor layers 22 and 26. Next, first and second contact electrodes 51 and 61 may be respectively deposited on the contact areas 22C and 26C.

The first insulating layer 41 may be formed of an insulating material selected from the group consisting of $SiO_2$, SiN, $TiO_2$, HfO, and $MgF_2$. The first insulating layer 41 may be conformally formed on inner sidewalls 44 of the second trenches T2 having a relatively large width, but almost entirely fill the first trenches T1 having a relatively small width. The first insulating layer 41 formed in the first trenches T1 may be provided as the filling insulator 47'. The first insulating layer 41 provided as the filling insulator 47' may have a lower refractive index than the active layer 24, and function as an optical structure changing a path of the ultraviolet light traveling in a lateral direction, together with inclined sidewalls of the first trenches T1, thereby improving light extraction efficiency. In some example embodiments, the first insulating layer 41 may be formed by a deposition process, such as a plasma-enhanced chemical vapor deposition (PECVD) process or a sputtering process.

The first and second contact electrodes 51 and 61 may include a single layer formed of one selected from the group consisting of Ag, Al, Ni, Cr, Pd, Cu, Pt, Sn, W, Au, Rh, Ir, Ru, Mg, Zn, and an alloy thereof, or a multilayer formed of a combination thereof. In some example embodiments, the first contact electrode 51 may include Ti/Al/Ni/Au, and the second contact electrode 61 may include Ag or Ni/Au.

Figure 11:
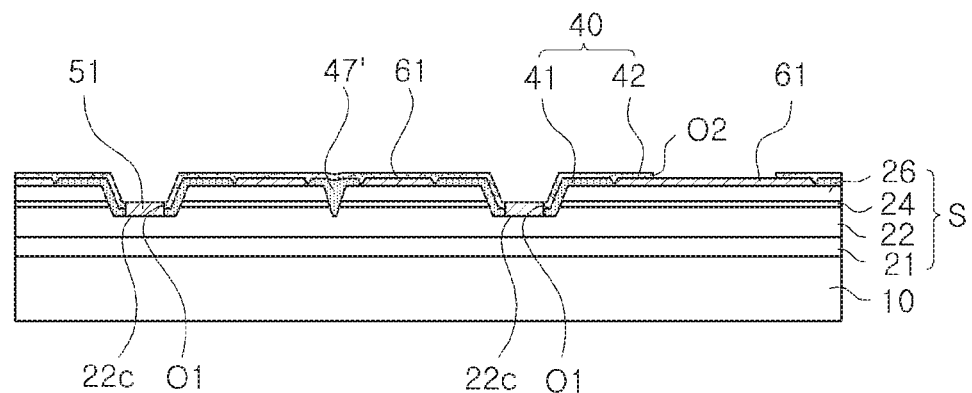

Next, referring to FIG. 11, a second insulating layer 42 may be formed on the first insulating layer 41 to cover the first and second contact electrodes 51 and 61, and first and second openings O1 and O2 partially opening the first and second contact electrodes 51 and 61 may respectively be formed on the second insulating layer 42.

The second insulating layer 42 may be formed of a silicon oxide layer, a silicon nitride layer, an insulating polymer layer, or a combination thereof. For example, the second insulating layer 42 may be formed of the same insulating material as the first insulating layer 41. In some example embodiments, the second insulating layer 42 may be formed by a deposition process, such as a PECVD process or a sputtering process, like the process of forming the first insulating layer 41.

The second insulating layer 42 may provide passivation protecting the ultraviolet semiconductor light emitting device 100A, together with the first insulating layer 41. In some example embodiments, the first and second openings O1 and O2 formed on the second insulating layer 42 may define areas connected to a bonding electrode to be formed in a subsequent process.

Figure 12:
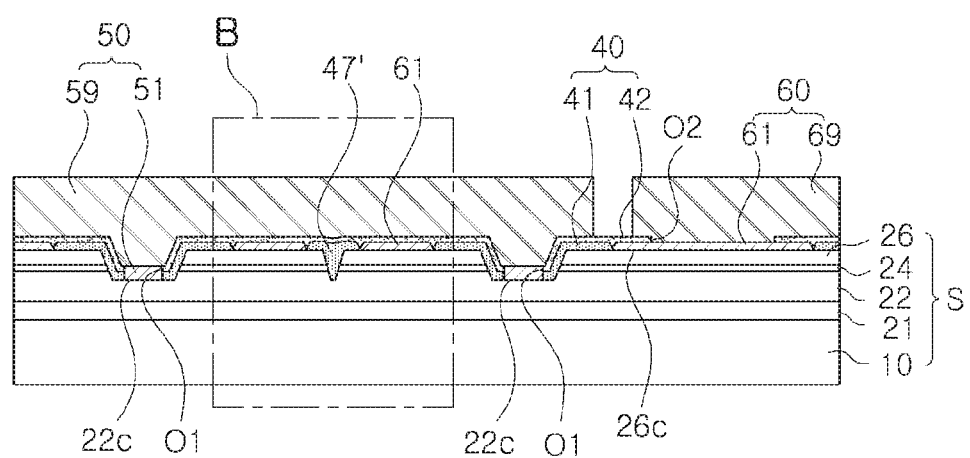

Next, referring to FIG. 12, first and second bonding pads connected to the first and second contact electrodes 51 and 61 through the first and second openings O1 and O2 may be formed.

By forming a first bonding metal 59 and a second bonding metal 69 respectively connected to the first contact electrode 51 and the second contact electrode 61, the arrangement of the bonding pads illustrated in FIG. 4 may be completed. For example, the first and second bonding metals 59 and 69 may include Au, Sn, or Au/Sn. In some example embodiments, the first and second bonding metals 59 and 69 may be formed of the same metal.

Through the processes described above, a trench having a relatively small width and a filling insulator filling the trench with an insulating material having a different refractive index from the active layer may be formed in the ultraviolet semiconductor light emitting device, in addition to a trench (that is, the second trench) in which an electrode is formed. Accordingly, light extraction efficiency in the upward direction may be improved. The trench and the filling insulator according to some example embodiments may be formed without performing an additional process and serve to improve luminous efficiency while minimizing the decrease in an area of the active layer.

As set forth above, the ultraviolet semiconductor light emitting device according to some example embodiments may have improved light extraction efficiency in the upward direction by forming a trench and filling the trench with an insulating material having a different refractive index from the active layer. Since the trench for extracting light is provided in a simple structure, luminous efficiency may be improved while minimizing the decrease in an area of the active layer. In particular, the trench for extracting light may be formed together with the trench for forming an electrode.

While example embodiments have been shown and described above, it will be apparent to those skilled in the art that modifications and variations could be made without departing from the scope of the present inventive concepts as defined by the appended claims.

What is claimed is:

1. An ultraviolet semiconductor light emitting device, comprising:
   a semiconductor stack including
      a first conductivity-type AlGaN semiconductor layer, the first conductivity-type AlGaN semiconductor layer including a first AlGaN semiconductor material,
      a second conductivity-type AlGaN semiconductor layer, the second conductivity-type AlGaN semiconductor layer including a second AlGaN semiconductor material, and
      an active layer between the first conductivity-type AlGaN semiconductor layer and the second conductivity-type AlGaN semiconductor layer and including a third AlGaN semiconductor material;
at least one trench extending to the first conductivity-type AlGaN semiconductor layer through the second conductivity-type AlGaN semiconductor layer and the active layer;
a filling insulator filling the at least one trench such that the at least one trench does not include other elements beyond the filling insulator and the filling insulator extends at least through the active layer in the at least one trench such that a top surface of the filling insulator within the at least one trench is distal to the first conductivity-type AlGaN semiconductor layer in relation to the active layer, the filling insulator including an insulating material, the insulating material having a lower refractive index than the active layer;
a first electrode connected to the first conductivity-type AlGaN semiconductor layer; and
a second electrode connected to the second conductivity-type AlGaN semiconductor layer,
wherein a sidewall angle of inclination ($\theta_0$) of the at least one trench, an incidence angle ($\theta_1$) in a lateral direction with respect to a sidewall of the at least one trench, and a refraction angle ($\theta_2$) with respect to the lateral direction satisfy the following equations (1) to (3):

$$\theta_0 = 90° - \theta_1 \ldots \quad (1)$$

$$n1 \times \sin(\theta_1) = n2 \times \sin(\theta_2) \ldots \quad (2)$$

$$\theta_2 \geq 9° + \theta_1 \ldots \quad (3),$$

wherein n1 is a refractive index of the active layer, and n2 is a refractive index of the insulating material.

2. The ultraviolet semiconductor light emitting device of claim 1, wherein the sidewall angle of inclination ($\theta_0$) of the at least one trench is equal to or less than about 80 degrees.

3. The ultraviolet semiconductor light emitting device of claim 1, wherein
the semiconductor stack includes a mesa-etching area that exposes a portion of the first conductivity-type AlGaN semiconductor layer, and
the first electrode is on the portion of the first conductivity-type AlGaN semiconductor layer.

4. The ultraviolet semiconductor light emitting device of claim 3, wherein a bottom surface of the mesa-etching area and a bottom surface of the at least one trench are spaced apart from a bottom surface of the first conductivity-type AlGaN semiconductor layer by a substantially common distance.

5. The ultraviolet semiconductor light emitting device of claim 1, wherein the active layer includes an alternating stack of first quantum well layers and second quantum well layers, the first quantum well layers including $Al_{xa}Ga_{1-xa}N$ (0<xa<1) and the second quantum well layers including $Al_{xb}Ga_{1-xb}N$ (xa<xb<1).

6. The ultraviolet semiconductor light emitting device of claim 1, wherein at least one semiconductor layer of the first conductivity-type AlGaN semiconductor layer and the second conductivity-type AlGaN semiconductor layer has a larger energy bandgap than the third AlGaN semiconductor material of the active layer.

7. The ultraviolet semiconductor light emitting device of claim 1, wherein the active layer is configured to emit light having a wavelength in a range of about 210 nm to about 315 nm.

8. The ultraviolet semiconductor light emitting device of claim 1, further comprising:
an electron blocking layer between the second conductivity-type AlGaN semiconductor layer and the active layer, the electron blocking layer including an AlGaN semiconductor layer having an Al composition ratio greater than an Al composition ratio of the second conductivity-type AlGaN semiconductor layer.

9. The ultraviolet semiconductor light emitting device of claim 1, wherein the insulating material includes at least one material selected from a group consisting of $SiO_2$, SiN, $TiO_2$, HfO, and $MgF_2$.

10. An ultraviolet semiconductor light emitting device, comprising:
a semiconductor stack including
a first conductivity-type AlGaN semiconductor layer, the first conductivity-type AlGaN semiconductor layer including a first AlGaN semiconductor material,
a second conductivity-type AlGaN semiconductor layer, the second conductivity-type AlGaN semiconductor layer including a second AlGaN semiconductor material, and
an active layer between the first conductivity-type AlGaN semiconductor layer and the second conductivity-type AlGaN semiconductor layer and including a third AlGaN semiconductor material;
at least one first trench extending to the first conductivity-type AlGaN semiconductor layer through the second conductivity-type AlGaN semiconductor layer and the active layer, the at least one first trench having a first width;
at least one second trench extending to the first conductivity-type AlGaN semiconductor layer through the second conductivity-type AlGaN semiconductor layer and the active layer, the at least one second trench having a second width, the second width greater than the first width;
a filling insulator filling the at least one first trench such that the at least one first trench does not include other elements beyond the filling insulator and the filling insulator extends at least through the active layer in the at least one first trench such that a top surface of the filling insulator within the at least one first trench is distal to the first conductivity-type AlGaN semiconductor layer in relation to the active layer, the filling insulator including an insulating material, the insulating material having a particular refractive index;
a first contact electrode connected to the first conductivity-type AlGaN semiconductor layer through the at least one second trench; and
a second contact electrode on the second conductivity-type AlGaN semiconductor layer.

11. The ultraviolet semiconductor light emitting device of claim 10, wherein a sidewall angle of inclination ($\theta_a$) of at least one first trench, an incidence angle ($\theta_1$) in a lateral direction with respect to a sidewall of the at least one first trench, and a refraction angle ($\theta_2$) with respect to the lateral direction satisfy the following equations (1) to (3):

$$\theta_0 = 90° - \theta_1 \ldots \quad (1)$$

$$n1 \times \sin(\theta_1) = n2 \times \sin(\theta_2) \ldots \quad (2)$$

$$\theta_2 \geq 9° + \theta_1 \ldots \quad (3),$$

wherein n1 is a refractive index of the active layer, and n2 is a refractive index of the insulating material.

12. The ultraviolet semiconductor light emitting device of claim 10, further comprising:

a first insulating layer on an inner sidewall of the at least one second trench and a portion of a top surface of the second conductivity-type AlGaN semiconductor layer.

13. The ultraviolet semiconductor light emitting device of claim 12, wherein the filling insulator and the first insulating layer include a common material, and a portion of the first insulating layer is in the at least one first trench.

14. The ultraviolet semiconductor light emitting device of claim 12, further comprising:
a second insulating layer on the first insulating layer, the second insulating layer including a first opening configured to open a portion of the first contact electrode and a second opening configured to open a portion of the second contact electrode; and
first and second bonding metals on the second insulating layer, the first and second bonding metals connected to the portions of the first and second contact electrodes through the first and second openings, respectively.

15. The ultraviolet semiconductor light emitting device of claim 12, wherein the at least one first trench and the at least one second trench have a substantially common depth.

16. The ultraviolet semiconductor light emitting device of claim 12, wherein
the at least one first trench and the at least one second trench have a common sidewall angle of inclination, and
a sidewall angle of inclination ($\theta_a$) of the at least one first trench and a sidewall angle of inclination ($\theta_b$) of the at least one second trench are each equal to or less than about 80 degrees.

17. The ultraviolet semiconductor light emitting device of claim 12, wherein
the at least one first trench has a V-shaped cross-sectional area, and
the at least one second trench has an inverted trapezoidal cross-sectional area.

18. The ultraviolet semiconductor light emitting device of claim 12, further comprising:
a plurality of first trenches, the plurality of first trenches including the at least one first trench, and the plurality of first trenches have a dot shape in a plan view.

19. The ultraviolet semiconductor light emitting device of claim 12, further comprising:
a plurality of first trenches, the plurality of first trenches including the at least one first trench, and the plurality of first trenches have a line shape in a plan view.

20. An ultraviolet semiconductor light emitting device, comprising:
a semiconductor stack including
a first conductivity-type semiconductor layer including a $Al_{x1}Ga_{1-x1}N$ (0<x1≤1) semiconductor material,
a second conductivity-type semiconductor layer including a $Al_{x2}Ga_{1-x2}N$ (0<x2≤1) semiconductor material, and
an active layer between the first and second conductivity-type semiconductor layers and including an $Al_{x3}Ga_{1-x3}N$ (0<x3<x1 and 0<x3<x2) semiconductor material;
a plurality of first trenches extending through the second conductivity-type semiconductor layer and the active layer to reach the first conductivity-type semiconductor layer, each first trench of the plurality of first trenches having a first width;
a plurality of second trenches extending through the second conductivity-type semiconductor layer and the active layer to reach the first conductivity-type semiconductor layer, each trench of the plurality of second trenches having a second width, the second width greater than the first width;
an insulating layer filling the plurality of first trenches and on inner sidewalls of the plurality of second trenches and top surfaces of the second conductivity-type semiconductor layer, such that each first trench of the plurality of first trenches does not include other elements beyond the insulating layer and a top surface of the insulating layer filling the plurality of first trenches is distal to the first conductivity-type semiconductor layer in relation to the active layer;
a first electrode connected to the first conductivity-type semiconductor layer through the plurality of second trenches; and
a second electrode on the second conductivity-type semiconductor layer.

* * * * *